United States Patent [19]

Kobayashi

[11] Patent Number: 5,068,652
[45] Date of Patent: Nov. 26, 1991

[54] PERSONAL COMPUTER HAVING CONDITION INDICATOR

[75] Inventor: Takaichi Kobayashi, Itsukaichi, Japan

[73] Assignee: Kabushiki Kaisha Toshiba, Kawasaki, Japan

[21] Appl. No.: 542,248

[22] Filed: Jun. 22, 1990

[30] Foreign Application Priority Data

Jun. 23, 1989 [JP] Japan .................................. 1-162218

[51] Int. Cl.⁵ ........................... G08B 5/22; G06F 1/00
[52] U.S. Cl. ........................... 340/815.03; 340/815.31; 340/762; 340/782; 362/800; 364/708
[58] Field of Search .............. 340/700, 762, 757, 782, 340/711, 815.03, 815.06, 815.07, 815.31, 825.82, 475, 691; 362/367, 800; 341/22; 364/708, 710.01; 116/202, 279; 313/498, 499, 500, 501

[56] References Cited

U.S. PATENT DOCUMENTS

| 4,048,634 | 9/1977 | Laflamme | 340/711 |
| 4,342,908 | 8/1982 | Henningsen et al. | 313/500 |
| 4,571,456 | 2/1986 | Paulsen et al. | 340/700 |
| 4,742,478 | 5/1988 | Nigro, Jr. et al. | 364/708 |

Primary Examiner—Alvin E. Oberley
Assistant Examiner—Chanh Nguyen
Attorney, Agent, or Firm—Cushman, Darby & Cushman

[57] ABSTRACT

An angular section used for condition indication has a first indication hole and a second indication hole. An indication element and a printed circuit board provided with a light-emitting diode are arranged inside the angular section. The indication element is made up of a light-transmission portion and an attachment portion. The light-transmission portion includes a first indication surface fitted in the first indication hole, a second indication surface fitted in the second indication hold, a slanted reflecting surface for reflecting incident light toward the second indication surface, and a light-incident surface extending between the lower end of the reflecting surface and the lower side of the attachment portion. Part of the light emitted from the light-emitting diode passes straight through the light-transmission portion, and emerges from the first indication surface, thus illuminating the first indication surface. The remaining light is reflected upward by the reflecting surface, and emerges from the second indication surface, thus illuminating the second indication surface.

10 Claims, 5 Drawing Sheets

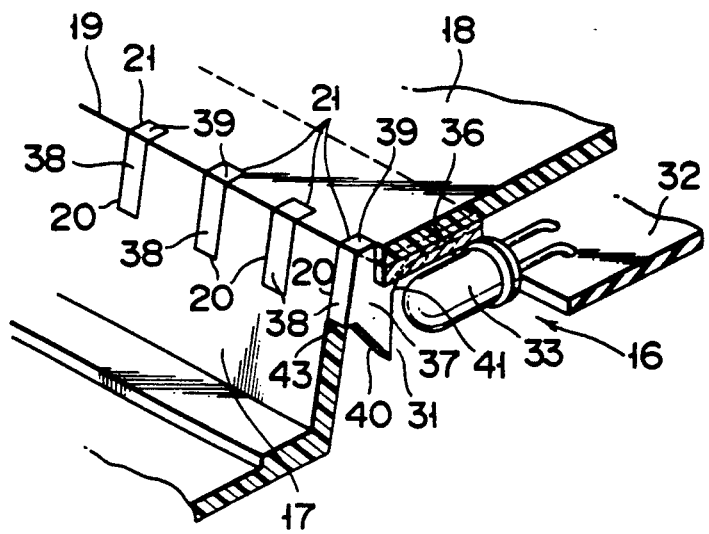
F I G. 4
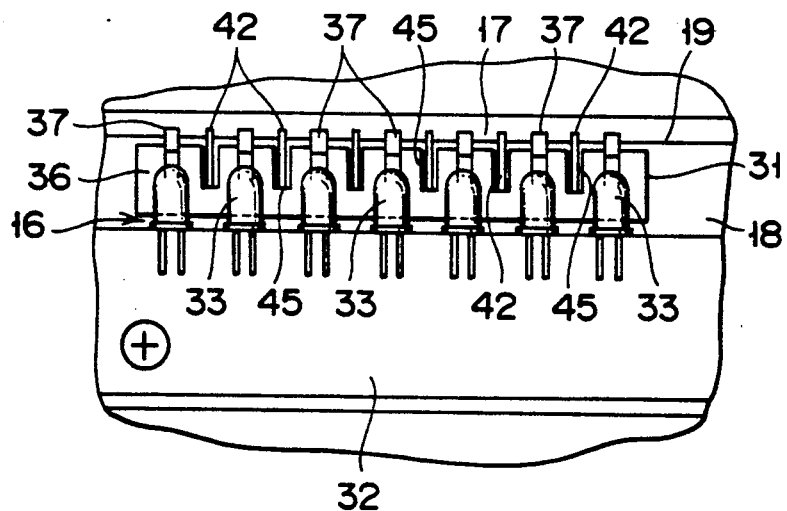
F I G. 5

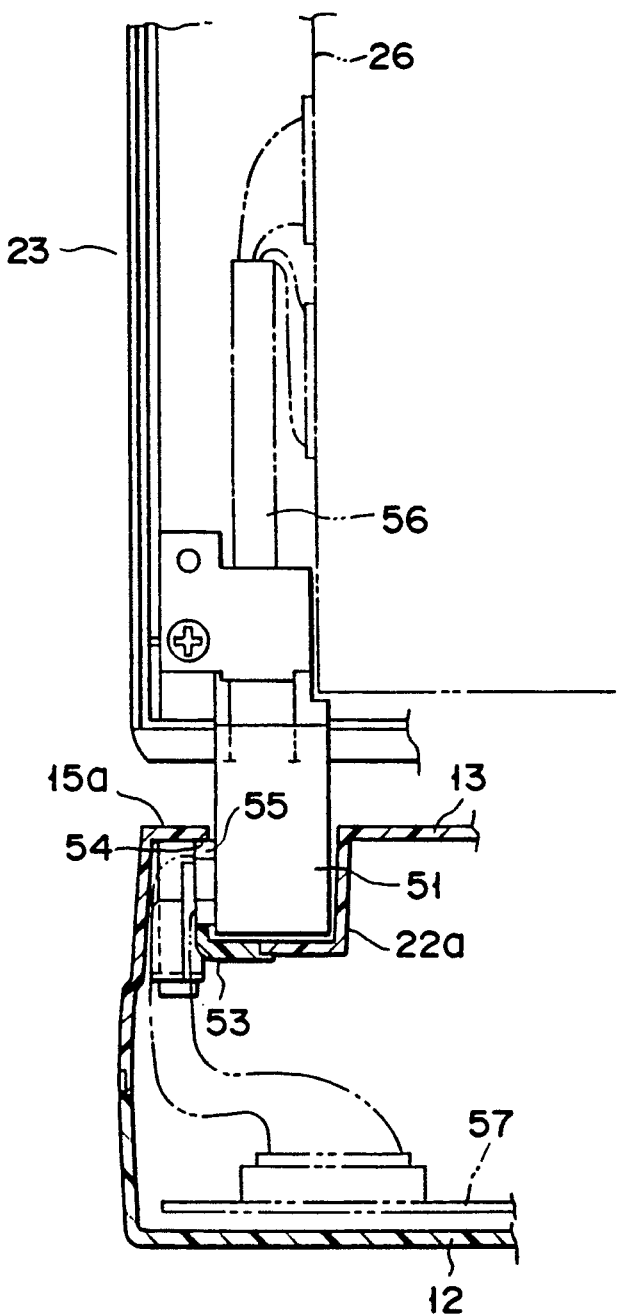
F I G. 6

PERSONAL COMPUTER HAVING CONDITION INDICATOR

BACKGROUND OF THE INVENTION

1. Field of the Invention

The present invention relates to a personal computer which has an indicator for indicating the operating condition of the computer with light-emitting element.

2. Description of the Related Art

Some conventional personal computers are provided with condition indicators. Among such condition indicators, there is a type wherein the lit state of one light-emitting diode can be indicated in two directions.

The top cover of a conventional personal computer incorporating this type of condition indicator has an angular section. This angular section is formed by a vertical first wall integral with the main body of the top cover, and a horizontal second wall continuous with the upper edge of the first wall. The first wall extends in the width direction of the top cover. The angular section has an indication hole extending between the first and second walls. Part of an indication element is fitted in the indication hole and is exposed, being flush with the outer wall of the angular section. The indication element is formed of a transparent material. A printed circuit board and light-emitting diode supported on the printed circuit board are arranged in the interior of the angular section, such that they are inclined with reference to the second wall of the angular section.

When the light-emitting diode is lit, the light is emitted diagonally upward, i.e., at an angle between the first and second walls. Since the indication element is transparent, it allows the light to pass therethrough, so that the light emitted from the light-emitting diode emerges from the two exposed surfaces of the indication element. Accordingly, the light can be recognized in two directions.

In the conventional personal computer mentioned above, the printed circuit board and the light-emitting diodes are arranged in the angular section in such a manner as to be inclined with reference to the second wall. Since the inclined printed circuit board and the light-emitting diodes require a larger installation space than a printed circuit board arranged horizontal, the first wall must have a certain extent of height in order to provide such a large installation space. Therefore, the inclined printed circuit board is disadvantageous, in that it does not allow provision of low angular section and is therefore not suitable for providing a flat personal computer.

Among the known condition indicators suitable for providing a flat personal computer, there is a type wherein the indication element is formed of glass containing a light-diffusing material and wherein the printed circuit board and the light-emitting diode are arranged parallel to the second wall.

In this type of condition indicators, the light emitted from the light-emitting diode diffuses in the indication element. Since the light emerges from the two exposed surfaces of the indication element, it can be recognized in two directions.

However, since the brightness of the light is reduced due to the light diffusion, the light cannot be easily recognized.

SUMMARY OF THE INVENTION

Accordingly, an object of the present invention is to provide a personal computer which has a condition indicator capable of indicating the lit state of a light-emitting element in two difference directions and permitting easy recognition of the lit state of the light-emitting element, and which eliminates the need to provide a large installation space in the height direction of the condition indicator.

To achieve this object, the present invention provides a personal computer, which comprises:

a top cover;

an angular section used for condition display and including first and second walls, the first wall being upright on the top cover and having a first indication hole, and the second wall being horizontal and continuous with the upper edge of the first wall and having a second indication hole;

an indication element formed of a light-transmission material of a non light-diffusion type and arranged in the inside of the angular section, the indication element including a light-transmission portion partly fitted in both the first and second indication holes, and an attachment portion integral with the light-transmission portion and attached to the second wall;

a printed circuit board arranged inside the angular section in the vicinity of the indication element and being substantially parallel to the second wall; and a light-emitting element attached to the printed circuit board and adapted to emit light toward the first indication hole, the light-transmission portion including:

a first indication surface which is fitted in the first indication hole and is located on the outer surface of the first wall in an exposed state;

a second indication surface which is fitted in the second indication hole and is located on the outer surface of the second wall in an exposed state;

a slanted reflecting surface located at a lower level than that of the first surface and adapted to reflect part of the light emitted from the lightemitting element toward the second indication surface; and a light-incident surface extending between the lower edge of the reflecting surface and the lower face of the attachment portion.

In the personal computer of the present invention, the light emitted from the light-emitting element enters the interior of the indication element from the light-incident surface. Part of the light entering the interior of the indication element emerges from the first indication surface, with the first indication surface illuminated. The remaining part of the light is reflected upward by the reflecting surface and is thus directed to the second indication surface, so that the light emerges from the second indication surface, with the second indication surface illuminated.

As mentioned above, the first indication surface is illuminated with the light coming directly from the light-emitting element, and the second indication surface is illuminated with the light reflected by the reflecting surface. Thus, the operating condition of the personal computer can be indicated in two directions. Because of this structure, it is not necessary to incline the printed circuit board and the light-emitting element with reference to the second wall. Accordingly, the size of the installation space for the condition indicator can be reduced in the height direction of the personal computer (in other words, the first wall need not be tall). In addition, each indication surface of the indication element can be sufficiently bright since the indication element is formed of a light-transmission material which does not diffuse light.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a partially-sectional perspective view illustrating the condition indicator;

FIG. 5 is a view showing how the condition indicator looks like when viewed in the direction indicated by arrow V in FIG. 3;

FIG. 6 is a sectional view of the portion indicated by "X" in FIG. 1 and illustrates the coupling structure between the display housing and the housing of the personal computer;

DETAILED DESCRIPTION OF THE PREFERRED EMBODIMENTS

An embodiment of the present invention will now be described, with reference to the accompanying drawings.

Figure 1:
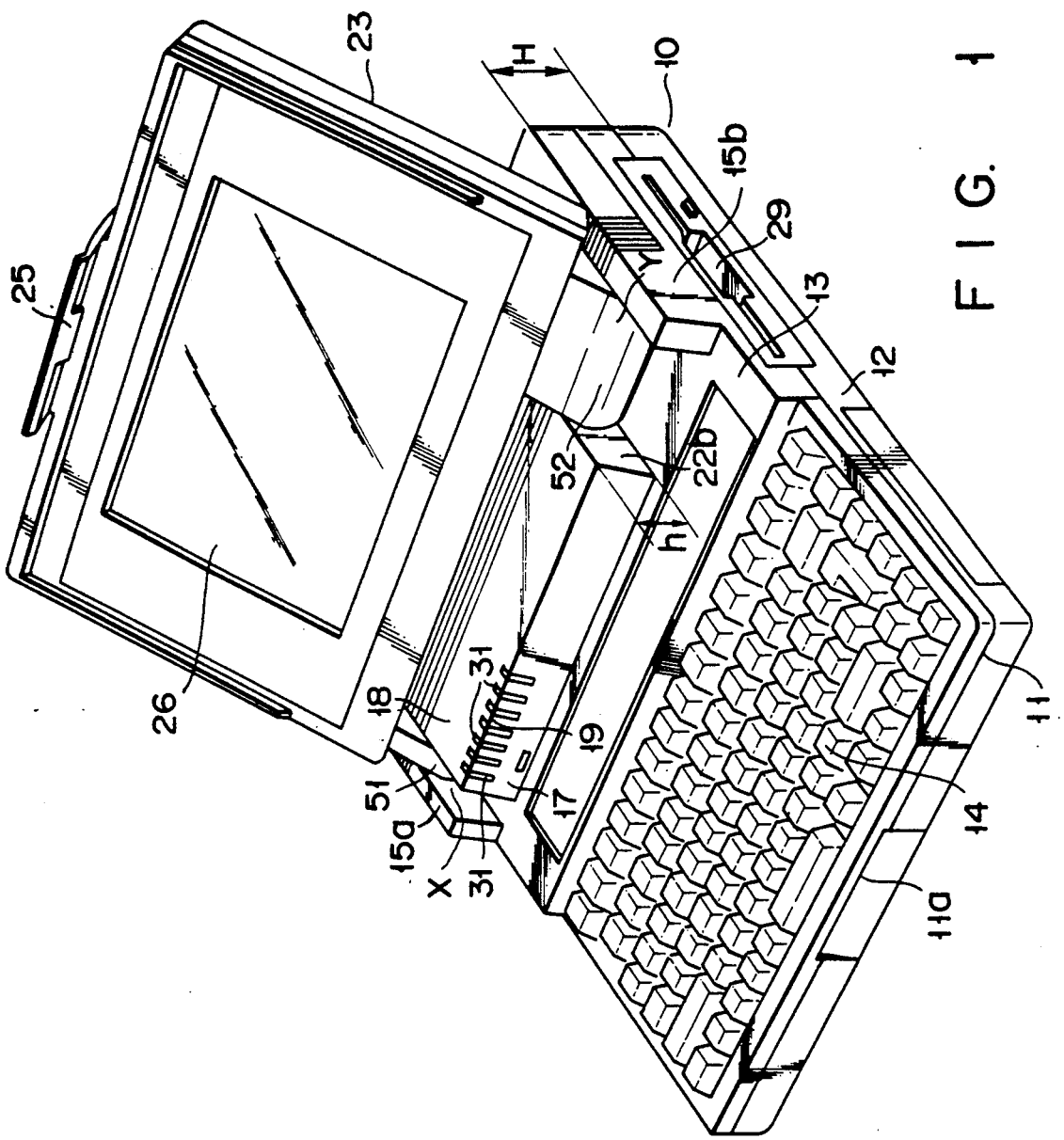
FIG. 1 is a perspective view of a lap top type personal computer according to one embodiment of the present invention, the personal computer being illustrated in a state where its display housing is opened.
Figure 2:
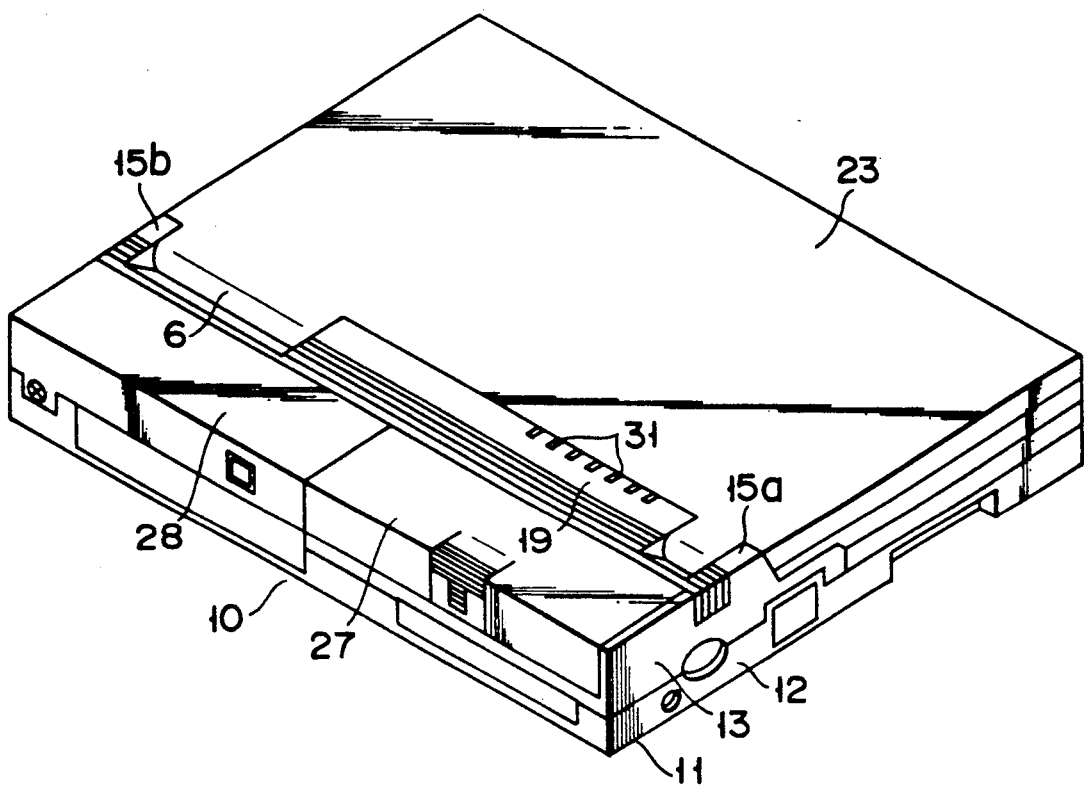
FIG. 2 is a perspective view of the personal computer shown in FIG. 1, the personal computer being illustrated in a state where its display housing is closed.

Referring to FIGS. 1 and 2, a lap top type personal computer 10 comprises a housing 11. The housing 11 is formed of synthetic resin and has a substantially rectangular planar shape. The housing comprises a base 12, and a top cover 13 located on the rear portion of the base 12. A keyboard 14 (the keys of which are exposed to the outside) is located on the front portion of the housing 11. A printed circuit board on which electronic parts are installed, a magnetic disk device, and other structural components necessary for the personal computer 10 (none of the structural components are not shown) are contained in the interior of the housing 11.

The top cover 13 arranged behind the keyboard 14 has a pair of pivotal support portions 15a and 15b located on the respective sides of the personal computer 10. The pivotal support portions 15a and 15b are upright portions and extend in the depth direction of the personal computer 10.

The top cover 13 also has an angular section 19 for indicating the operating condition of the personal computer 10. This angular portion 19 is located between the paired pivotal support portions 15a and 15b, and is constituted by a first wall 17 and a second wall 18.

The first wall 17 is integral with the top cover 13 and stands upright on the front portion of the top cover 13, with the surface orientated frontward. The first wall 17 extends in the width direction of the top cover 13, and is inclined such that the upper edge is located closer to the rear of the personal computer 10 than the lower edge. The second wall 18 is integral with the first wall 17 and is continuous with the upper edge of the first wall 17. It extends horizontally toward the rear portion of the top cover 13. The second wall 18 and the upper surface of each pivotal support portion 15a or 15b are at the same level as the tallest portion of the top cover 13.

The first wall 17 has seven first indication holes 20 formed therein. Each indication hole 20 is like a slit and extends in the height direction of the first wall 17. The indication holes 20 are arranged at predetermined intervals in the width direction of the top cover 13. Likewise, the second wall 18 has second indication holes 21 formed therein. The second indication holes 21 are the same in number as the first indication holes 20. The second indication holes 21 have the same width as the first indication holes 20, and extend in the depth direction of the second wall 18. The front region of each second indication hole 21 corresponds in location to the upper region of the respective first indication hole 20. In other words, each first indication hole 20 and its corresponding second indication hole 21 jointly constitute one hole extending between the first and second walls 17 and 18.

The top cover 13 has a pair of end walls 22a and 22b located on the respective sides of the angular section 19. One projection 51 of the display housing 23 is located between end wall 22a and pivotal support portion 15a and is swingably supported by the top cover 13. Likewise, the other projection 52 of the display housing 23 is located between end wall 22b and pivotal support portion 15b and is swingably supported by top cover 13. Therefore, the display housing 23 can be raised or laid down around the top cover 13.

The coupling construction regarding one projection 51 is shown in FIG. 6. As is shown in FIG. 6, a cover member 53 is attached to that portion of the pivotal support portion 15a which is located on the side of end wall 22a. An opening 54 is defined between the cover member 53 and the pivotal support portion 15a. A cylindrical portion 55 projected from one side of the projection 51 is swingably fitted in the opening 54, so that the projection 51 is swingable with the opening 54 as a center. A cable 56 passes through the interiors of the projection 51 and cylindrical portion 55, and is guided into the pivotal support portion 15a. The cable 56 electrically connects a printed wiring board 57 built in the housing 11 to a flat panel display to be mentioned later.

Figure 7:
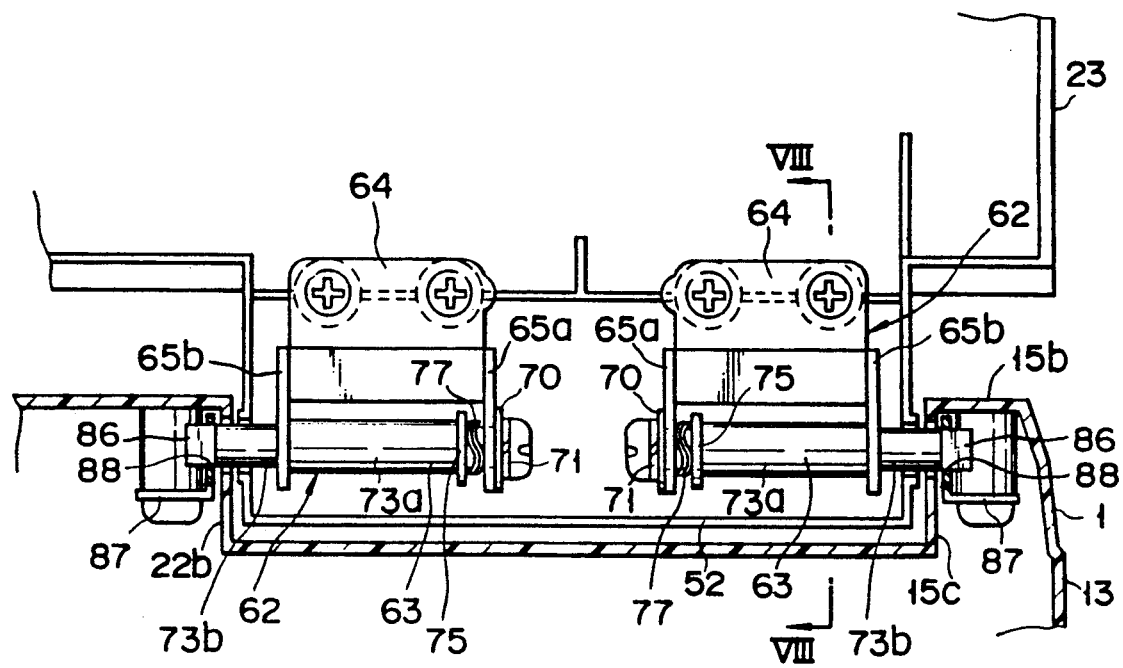
FIG. 7 is a sectional view of the portion indicated by "Y" in FIG. 1 and illustrates the coupling structure between the display housing and the housing of the personal computer.
Figure 8:
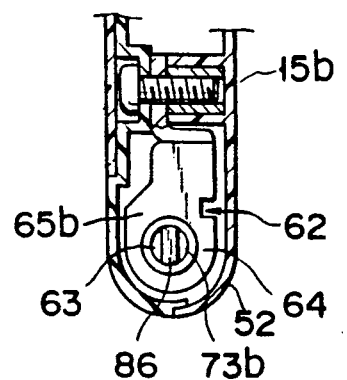
FIG. 8 a sectional view taken along line VIII—VIII in FIG. 7.

The coupling construction regarding the other projection 52 is shown in FIGS. 7 and 8. A pair of hinges 62 are provided inside the projection 52. Since the hinges 62 are similar in construction, only one of them will be explained hereinafter. The hinge 62 is made up of a hinge shaft 63, and a bracket 64 which supports the hinge shaft 63. The bracket 64 includes a pair of plate-like bearings 65a and 65b, and is fixed to the display housing 23. The bearings 65a and 65b each have a through-hole (not shown), and ends of the hinge shaft 63 are rotatably inserted in the respective throughholes. A plain washer 70 and a spring washer 71 are fitted around one end of the hinge shaft 63 and are secured by a screw, so as to prevent the hinge shaft 63 from slipping off the hinge 62.

The hinge shaft 63 has a large-diameter portion 73a, and first and second small-diameter portions 73b extending from the respective ends of the large-diameter portion 73a. The first small-diameter portion 73b is fitted in the through-hole of bearing 65b, while the second small-diameter portion 73b is inserted in two annular wave washers 77 and is fitted the through-hole of bearing 65a. The wave washers 77 are sandwiched between a plain washer 75 and bearing 65a and are therefore held in a compressed state. Due to the force generated by the wave washers 77, friction is produced between the plain washer 75 and bracket 64, so that the relative rotation between the hinge shaft 63 and the bracket 64 is suppressed to a certain extent.

The second small-diameter portion 73b of the hinge shaft 63 extends through either end wall 22b of the top cover 13 or the wall portion 15c of the pivotal support portion 15b and is led into the interior of the top cover 13. A support member 87 having an angular hole 88 is arranged inside the top cover 13. A stopper portion 86 formed at the tip end of the second small-diameter portion 73b and having a shape conforming with that of the hole 88 is fitted in the hole 88 of the support member 87, thereby preventing the hinge shaft 63 from rotating.

With the hinge having the above-construction, the display housing 22 is pivotally supported. In addition, the display housing 22 can be held at any desirable position between the full-open position and the closed position.

The size of the display housing 23 is determined such that the display housing 23 covers the keyboard 14 when it is laid down. As is shown in FIG. 1, the display housing 23 has a hook portion 25. With the hook portion 25 engaged with a groove 11a formed in the housing 11, the display housing 23 can be kept in the laid-down state.

The display housing 23 has a flat panel display 26 of a liquid crystal type. When the display housing 23 is raised, the display 26 is exposed in front of the housing 23.

In FIG. 2, reference numeral 27 denotes a battery pack which is detachably provided for the upper side of the rear portion of the housing 11, and reference numeral 28 denotes an option cover which is located on the side of the battery pack 27 and is detachably provided for the upper side of the rear portion of the housing 11. The upper and rear surfaces of the battery pack 27 and those of the option cover 28 constitute part of the outer surfaces of the housing 11. When the display housing 23 is laid down or closed, its upper surface becomes flush with both the upper surface of the battery pack 27 and that of the option cover 28. Reference numeral 29 in FIG. 1 denotes an inlet/outlet port through which a floppy disk (not shown) is pushed in or taken out.

The second wall 18 is kept exposed at all times. In other words, it can be visually recognized when the display housing 23 is open (i.e., in the raised state), as is shown in FIG. 1, and when it is closed (i.e., in the laid-down state), as is shown in FIG. 2. In contrast, the first wall 17 is exposed and can be therefore visually recognized only when the display housing 23 is open. When the display housing 23 is closed, the first wall 17 is covered with the housing 23.

To indicate an operation condition of the personal computer 10, one indication element 31, one printed circuit board 32, and seven light-emitting diodes 33 are arranged in the interior of the angular section 19. These structural components 31–33 jointly constitute a condition indicator 16, as will be detailed below.

The printed circuit board 32 is located under the second wall 18 and is substantially parallel to the second wall 18. The expression "substantially parallel" covers not only the case where the printed circuit board 18 is completely parallel to the second wall 18 but also the case where it is inclined more or less with reference to the second wall 18 as long as the inclination does not result in an increase in the height of the condition indicator 16 (or height h of the first wall 17).

The light-emitting diodes 33 (i.e., light-emitting elements) are arranged before the front edge of the printed circuit board 33 while being spaced from each other. The axis of each light-emitting diode 33 is substantially parallel to the plane of the printed circuit board 32, and the light-emitting end 35 of each diode 33 faces the corresponding first indication hole 20. Circuit components (not shown) necessary for lighting the light-emitting diodes 33 are installed on the printed circuit board 32.

The indication element 31 is formed of light-transmission material of a non light-diffusion type. It is formed of e.g. transparent acrylic resin, and is either colorless or colored. The indication element 31 includes one attachment portion 36 and seven light-transmission portions 37. (The number of light-transmission portions 37 corresponds to the number of first indication holes 20 or second indication holes 21.) The attachment portion 36 is like a flat plate extending in the width direction of the second wall 18, and is fixed to the inner surface of the second wall 18 such that the other portions of the indication element 31 are located inside the angular section 19. The attachment portion 36 is fixed to the second wall 18 by adhesion, screwing, thermal caulking, or the like.

The light-transmission portions 37 are located in front of the attachment portion 36. They are integrally projected from the attachment portion 36 while being spaced from each other. The longitudinal axis of each light-transmission portion 37 is perpendicular to the attachment portion 36. Each light-transmission portion 37 has a first indication surface 38, a second indication surface 39, a reflecting surface 40, and a light-incident surface 41. These surfaces 38–41 will be detailed below.

The first indication surface 38 is fitted in the first indication hole 20. More specifically, it fills the region in the first indication hole 20 and is exposed, being flush with the outer surface of the first wall 17.

The second indication surface 39 is fitted in the second indication hole 21. More specifically, it fills the region in the second indication hole 21 and is exposed, being flush with the outer surface of the second wall 18. The front edge of the second indication surface 39 is continuous with the upper edge of the first indication surface 38. A vertical surface 42 having a height equal to the thickness of the second wall 18 is located behind the second indication surface 39. Through this vertical surface 42, the second indication surface 39 is continuous with the attachment portion 36.

The reflecting surface 40 is located at a lower level than that of the first indication surface 38. The reflecting surface 40 and the first indication surface 38 are continuous with each other through a horizontal surface 43 which is in contact with the lower end of the first indication hole 20. The reflecting surface 40 is slanted such that its lower end is located more away from the inner surface of the first wall 17 than its upper end. The reflecting surface 40, thus slanted, serves as a prism reflecting surface, which reflects the incident light (which is emitted from the light-emitting diode 33) toward the second indication surface 39.

The light-incident surface 41 is located between the lower edge of the reflecting surface 40 and the lower side of the attachment portion 36. The light-incident surface 41 is curved; specifically, it has an arcuate portion located on the side of the attachment portion 36. The light-emitting end 35 of one light-emitting emitting diode 33 is located near the light-incident surface 41 and faces it.

Reference numeral 42 in FIG. 5 denotes six ribs integrally projected from the inner surface of the angular section 19. Each rib 42 is located between the adjacent light-transmission portions 37, so as to prevent the light emitted from the light-emitting diodes 33 from diffusing widthwise. Reference numeral 45 in FIG. 5 denotes grooves which are formed in the attachment portion 36 and through which the ribs 42 passes.

During the use of the personal computer 10 mentioned above, a mode is selected and established in accordance with the operation of the keyboard 14. The light-emitting diode 33 corresponding to the established mode is lit, so that the mode (i.e., an operating condition) of the personal computer 10 is indicated by the condition indicator 16.

Next, a detailed description will be given as to how the condition indication is performed.

Figure 3:
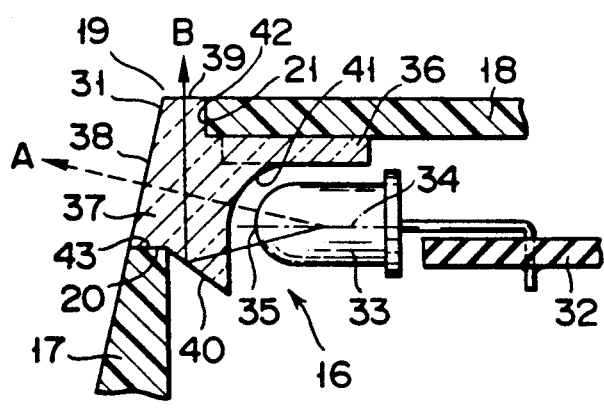
FIG. 3 is a sectional view illustrating a condition indicator employed in the personal computer shown in FIG. 1.

When one of the light-emitting diodes 33 is lit, the light is directed frontward in a particular direction. The light is incident on the light-incident surface 41 and enters the light-transmission portion 37 of the indication element 31. Then, the light emerges from the first indication surface 38. As a result, the first indication surface 38 is illuminated, thus indicating the operating condition of the personal computer 10. An example of an optical path of this light is indicated by arrow A in FIG. 3.

The light-incident surface 41 is curved and doe not have a bent portion. Therefore, the entire area of the first indication surface 38 can be uniformly illuminated with the light. Thus, the light at the first indication surface 38 is easy to recognize when it is looked at from the front region of the personal computer 10. If the light-incident surface 41 has a bent portion, the light is reflected by such a bent portion. Therefore, when the first indication surface 38 is observed from the front region of the personal computer 10, the state of the light does not look uniform due to the bent portion. Accordingly, the first indication surface 38 fails to clearly indicate the operating condition of the personal computer 10.

Part of the light entering the light-transmission portion 37 and advancing toward the first indication hole 20 is incident on the slanted reflecting surface 40. Since this light is reflected by the reflecting surface 40, it is directed upward and emerges from the second indication surface 39. Thus, the second indication surface 39, which is exposed and is flush with the second wall 18, is illuminated with the light, whereby the operating condition of the personal computer 10 is indicated. An example of an optical path of this light is indicated by arrow B in FIG. 3.

As mentioned above, the first indication surface 38 is illuminated with the light coming directly from the light-emitting diodes 33, and the second indication surface 39 is illuminated with the light reflected by the reflecting surface 40. In this manner, the operating condition of the personal computer 10 is indicated in two directions.

Since the operating condition of the personal computer can be recognized in two directions, the printed circuit board 32 and the light-emitting diodes 33, located within the angular section 19 of the top cover 13, need not be inclined with reference to the second wall 18; they can be arranged substantially parallel to the second wall 18. With this construction, a small installation space is sufficient for the arrangement of the condition indicator 16. Therefore, height h of the top cover 13 can be reduced, and thus the housing 11 of the personal computer 10 can be made flat.

Since the indication element 31 is formed of a light-transmission material which does not diffuse light, the light hardly attenuates in the light-transmission portion 37. Therefore, the first and second indication surfaces 38 and 39 are illuminated with a sufficient amount of light. In other words, the first and second indication surfaces 38 and 39 are sufficiently bright. Since the entire areas of the indication surfaces 38 and 39 are sufficiently bright, the indication surfaces 38 and 39 can be reliably recognized in two directions. In addition, the light-transmission material of a non light-diffusion type is lower in cost than light-diffusion glass. Therefore, it is possible to reduce the manufacturing cost of the condition indicator 16.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A personal computer provided with both a condition indicator and a keyboard, comprising:
   a top cover;
   an angular section including first and second walls, said first wall being upright on the top cover and having a first indication hole, and said second wall being horizontal and continuous with an upper edge of the first wall and having a second indication hole;
   an indication element formed of a light-transmission material of a non light-diffusion type and arranged inside of the angular section, said indication element including a light-transmission portion partly fitted in both the first and second indication holes, and an attachment portion integral with the light-transmission portion and attached to the second wall;
   a printed circuit board arranged inside the angular section in the vicinity of the indication element and being substantially parallel to the second wall; and
   a light-emitting element attached to the printed circuit board and adapted to emit light toward the first indication hole, said light-transmission portion including:
a first indication surface which is fitted in the first indication hole and is located on an outer surface of the first wall in an exposed state;
a second indication surface which is fitted in the second indication hole and is located on the outer surface of the second wall in an exposed state;
a slanted reflecting surface located at a lower level than that of the first surface and adapted to reflect part of the light emitted from the light-emitting element toward the second indication surface; and
a light-incident surface extending between a lower edge of the reflecting surface and a lower face of the attachment portion.

2. A personal computer according to claim 1, wherein said second indication hole is continuous with an upper end region of the first indication hole, and said second indication surface is continuous with an upper end portion of the first indication surface.

3. A personal computer according to claim 1, wherein said angular section is located behind the keyboard.

4. A personal computer according to one of claims 1 and 2, wherein the first wall of said angular section extends in a width direction of the top cover.

5. A personal computer according to claim 4, wherein said first wall is inclined such that an upper edge thereof is closer to a rear portion of the top cover.

6. A personal computer according to claim 1, wherein said light-emitting element is a light-emitting diode.

7. A personal computer according to claim 1, wherein said light-transmission portion includes at least two light-transmission parts.

8. A personal computer according to claim 7, wherein said angular section includes at least one light-shielding rib which is integrally projected from an inner surface of the angular section, said at least one light-shielding rib being located between adjacent ones of the light-transmission portions.

9. A personal computer according to claim 1, wherein said light-incident surface is curved.

10. A personal computer according to claim 1, wherein said top cover swingably supports a display housing which can cover the keyboard, said display housing completely exposing the angular section when the display housing is raised with reference to the top cover, and covering the first wall and exposing the second wall when the display housing is laid down to cover the keyboard.

* * * * *